United States Patent
Oosterlaken

(10) Patent No.: US 6,582,221 B1
(45) Date of Patent: Jun. 24, 2003

(54) WAFER BOAT AND METHOD FOR TREATMENT OF SUBSTRATES

(75) Inventor: Theodurus Gerardus Maria Oosterlaken, Oudewater (NL)

(73) Assignee: ASM International N.V. (NL)

( * ) Notice: Subject to any disclaimer, the term of this patent is extended or adjusted under 35 U.S.C. 154(b) by 4 days.

(21) Appl. No.: 10/200,573

(22) Filed: Jul. 19, 2002

(51) Int. Cl.⁷ .................................................. F27D 5/00
(52) U.S. Cl. .......................... 432/5; 432/253; 432/258
(58) Field of Search ........................... 432/5, 6, 81, 253, 432/258, 259; 211/41.18

(56) References Cited

U.S. PATENT DOCUMENTS

| | | | |
|---|---|---|---|
| 4,407,654 A | | 10/1983 | Irwin |
| 5,162,047 A | | 11/1992 | Wada et al. |
| 5,219,079 A | | 6/1993 | Nakamura |
| 5,310,339 A | | 5/1994 | Ushikawa |
| 5,316,472 A | | 5/1994 | Niino et al. |
| 5,334,257 A | | 8/1994 | Nishi et al. |
| 5,482,558 A | | 1/1996 | Watanabe et al. |
| 5,482,559 A | | 1/1996 | Imai et al. |
| 5,492,229 A | | 2/1996 | Tanaka et al. |
| 5,858,103 A | * | 1/1999 | Nakajima et al. ............ 118/728 |
| 5,931,666 A | | 8/1999 | Hengst |
| 6,203,617 B1 | * | 3/2001 | Tanoue et al. ............... 118/695 |
| 6,341,935 B1 | * | 1/2002 | Tseng .......................... 414/800 |
| 6,361,313 B1 | * | 3/2002 | Beyaert et al. .............. 432/259 |
| 6,464,445 B2 | * | 10/2002 | Knapik et al. .......... 414/416.03 |

FOREIGN PATENT DOCUMENTS

JP    63102225 A    5/1988

* cited by examiner

Primary Examiner—Gregory Wilson
(74) Attorney, Agent, or Firm—Knobbe, Martens, Olson & Bear, LLP

(57) ABSTRACT

A substrate holder for vertical furnaces is configured to support substrates in slots at inner portions of the substrates, rather than solely at the edges. The holder allows sufficient clearance above substantially the entire front face of the substrate that a substrate deflection or bow, induced by thermal stresses during loading and unloading of the substrate holder into and out of the furnace, can be accommodated without the substrate touching the support members of the substrate holder. A relationship is established such that, for given loading/unloading temperatures, a minimum amount of free space in the wafer slots is provided to avoid substrate scratching. Conversely, for a given amount of free space in the wafer slots, the relationship provides maximum loading and/or unloading temperatures to avoid scratching.

14 Claims, 5 Drawing Sheets

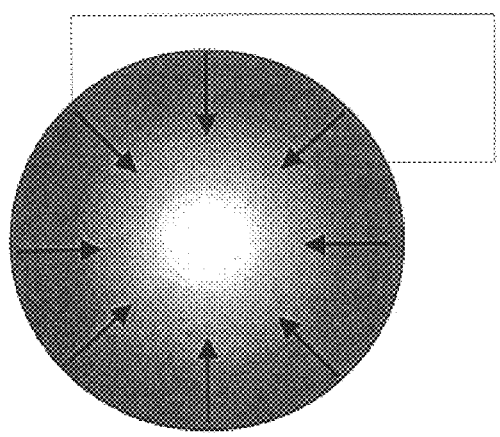
Figure 2A
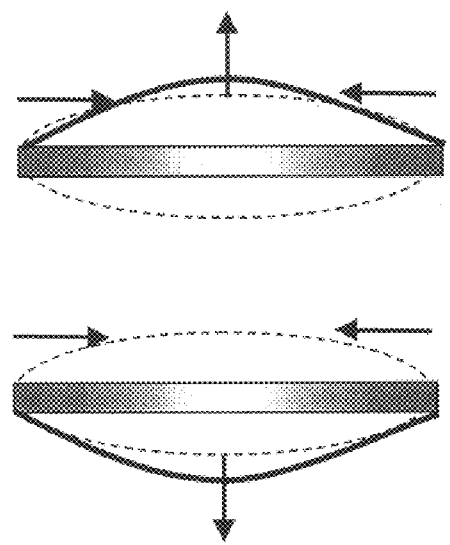
Figure 2B
Figure 2

WAFER BOAT AND METHOD FOR TREATMENT OF SUBSTRATES

BACKGROUND OF THE INVENTION

1. Field of the Invention

This invention relates generally to the field of thermal treatment of substrate and, more particularly, to the batch-wise thermal treatment of substrates wherein a plurality of substrates are accommodated in a vertically spaced-apart relationship in a substrate holder during the thermal treatment in a furnace.

2. Description of the Related Art

The batch-wise thermal treatment of substrates, such as semiconductor wafers, in vertical furnace is known in the art. In a vertical furnace, substrates are accommodated in a vertically spaced-apart relationship in a substrate holder (e.g., vertical wafer boat) during the thermal treatment. Typically, the substrates are supported at their edge in such a substrate holder. With the increasing diameter of semiconductor wafers, while their thickness was only marginally increased, these wafers became more and more susceptible to plastic deformation during thermal treatment. Unfortunately, the mechanical strength of the substrate reduces at high temperature and the stresses in the substrate, due to gravitational forces and temperature gradients, can easily exceed the yield strength of the substrate at temperatures at 900° C. or above.

As a solution, substrate holders were proposed that support the substrates not only at the edge but also at an inner area, spaced from the edge. In this way, gravitational stresses are strongly reduced. Various designs for such substrate holders were proposed, as exemplified by, U.S. Pat. No. 5,931,666, to Hengst and U.S. Pat. No. 5,492,229 to Tanaka. These substrate holders are effective in preventing plastic deformation of the substrates. However, another problem became apparent: scratches were observed on the front side of the substrates. The positions of the scratches on the substrates correspond with the positions of the support members of the substrate holders.

It is an object of the present invention to provide a solution for the occurrence of scratches on the front sides of substrates when they are subjected to a thermal treatment while still supporting the substrate at an inner area.

SUMMARY OF THE INVENTION

In accordance with one aspect of the invention, a substrate holder is configured to support a substrate at an inner area. The holder allows sufficient clearance above substantially the entire front face of the substrate that a substrate deflection or bow, induced by thermal stresses during loading and unloading of the substrate holder into and out of the furnace, can be accommodated without the substrate touching the support members of the substrate holder. Sufficiently low loading and unloading temperatures are selected in conjunction with the amount of free space in the substrate holder accommodation or slot.

In accordance with another aspect of the invention, a substrate holder is configured to hold a plurality of substrates in a vertically spaced-apart relationship. The substrate holder includes a plurality of support accommodations that at least partially support a substrate at an inner area spaced from the substrate edge. Each support accommodation has a free height between vertically spaced support members of between 4.5 mm and 12 mm.

In accordance with another aspect of the invention, a method is provided for thermal treatment of substrates. The method includes providing a holder with a plurality of accommodations in a vertically spaced-apart relationship. Each accommodation is capable of supporting a substrate horizontally at an inner area, which is spaced from the substrate edge by at least 20 mm, and each accommodation has a free height (h). A plurality of substrates is supported in the holder. The substrate holder with the supported substrates is loaded into a vertical furnace at a loading temperature ($T_{load}$). The furnace is then heated to a thermal treatment temperature and the thermal treatment is performed. After performing the thermal treatment, the furnace is cooled to an unloading temperature $T_{unload}$. The substrate holder is unloaded from the furnace. The method also includes selecting one of (h) and ($T_{unload}$) and determining the other of (h) and ($T_{unload}$) according to a predetermined relationship between the free height and the unloading temperature in which scratching of the substrates is avoided.

In accordance with another aspect of the invention, a method is provided for avoiding scratches on substrates supported in a vertical furnace, in which each substrate is at least partially supported at a point at least 20 mm from the substrate edge. The method includes providing a substrate rack with a plurality of vertically stacked support slots, where the slots have a set free height between the lower surface of a first supported substrate and a support structure above the supported substrate. An unloading temperature is selected to avoid substrate scratching for the set free height. A batch of substrates supported in the substrate rack are processed at a process temperature. The substrates are then cooled from the process temperature to the selected unloading temperature, and the rack with the substrates is unloaded at the selected unloading temperature.

BRIEF DESCRIPTION OF THE DRAWINGS

These and other aspects of the invention will be readily apparent to the skilled artisan in view of the detailed description of the preferred embodiments below, and in view of the appended drawings, which are meant to illustrate and not to limit the invention, and in which:

FIG. 2 presents top down and schematic cross-sectional view illustrating thermal gradients and stresses upon a wafer during cool down after thermal processing.

DETAILED DESCRIPTION OF THE PREFERRED EMBODIMENT

When flat substrates, such as semiconductor wafers, are processed while accommodated in a substrate holder in a vertically spaced apart relationship, a minimum pitch between the substrates is dictated by the clearance that allows safe processing and robotic loading of the substrates without mechanically contacting the front surface of the substrates. This minimum pitch depends on the thickness of the substrates, the natural bow of the substrates, the bow induced by previous processing and the bow occurring during present processing.

Figure 1:
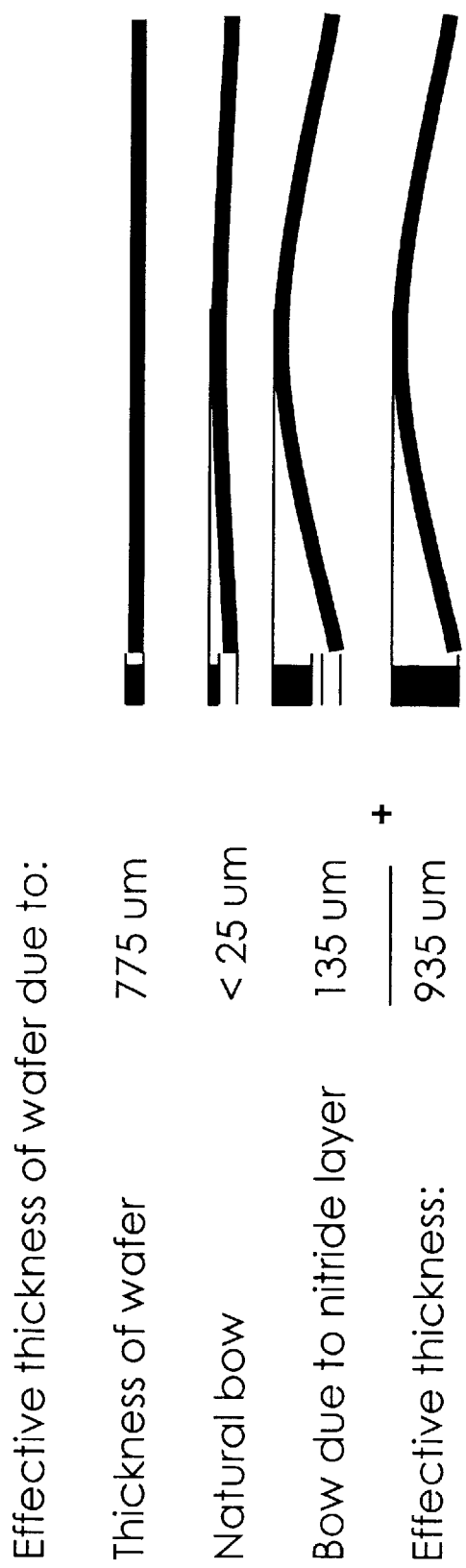
FIG. 1 is series of schematic cross sections illustrating bowing of wafers supported within a vertical furnace boat.

For a silicon wafer of 300 mm diameter, the effective thickness of the wafer at the start of the thermal treatment is schematically presented in FIG. 1. The physical thickness of the wafer is 775 µm. The wafer is not perfectly flat but is inflicted with some bow, which is generally specified by manufacturers to be less than 25 µm. Due to previous processing, such as the deposition of a silicon nitride film, an additional bow of 135 µm (for a total of 160 µm) can be present. The effective thickness of the wafer, which is the height of a cylinder that can just accommodate the bowed wafer, is obtained by the sum of these values and is 935 µm (0.935 mm).

During thermal treatment of the wafer, additional bow occurs due to gravitational stress and due to thermal stress. The bow due to gravitational stress is largely counteracted by a substrate holder design supporting a substrate at an inner area (in addition to edge support). Such a holder at least partially supports a substrate inwardly from the substrate edge, preferably at positions spaced at least about 20 mm inwardly from the wafer edge. More preferably, the inner support positions are spaced at least about 30 mm inwardly from the substrate edge, and most preferably spaced inwardly from the edge by at least about 40 mm. By this it is meant that the support members underlie a point of the substrate that is positioned inwardly from the substrate edge by at least the given amount. Such support members may actually extend inwardly from the substrate edge (as in the illustrated embodiment), or may include independent support members beneath the central or inner area of the substrate. Independent support members need not necessarily be connected to edge supports. Preferably, however, the support structures are designed to keep the underside of the geometric center of each substrate open, advantageously permitting robotic end effectors to interfere in this location and facilitating automated transfer. In the following it is assumed that such a wafer holder with support under an inner area or the substrate has been used and the gravitational bow will be neglected. During heat-up or cool-down of the wafer, a thermal gradient is induced across the wafer.

FIG. 2 schematically illustrates thermal gradients during temperature ramps. During heat-up, the wafer edge is hotter than the wafer center and during cool-down the wafer edge is colder than the wafer center. In the cool-down situation, in particular, the wafer tends to bow because the wafer edge shrinks and exerts compressive forces on the center part of the wafers shown in FIG. 2A. As a result, the wafer buckles upward (FIG. 2A) or downward (FIG. 2B). During heat-up, the wafer edge expands and exerts a tensile force on the center part of the wafer. Therefore, the tendency to bow is less during heat-up as compared to cool-down.

Concerns over thermal stress are particularly relevant for silicon wafers with a diameter of 200 mm or 300 mm or larger. For these wafer sizes it was found that plastic deformation of the wafers can occur at temperatures as low as 900° C. Certainly, for process temperatures of 1000° C. or higher plastic deformation is significant and for temperatures of 1100° C. or higher plastic deformation will be dramatic. Therefore, it is advantageous to utilize wafer holders that support the wafers at an inner area, spaced from the edge, to reduce stresses due to gravitational forces and reduce or avoid the plastic deformation.

Despite an expectation that problems would arise at the peak temperatures during processing, it has been discovered that the loading and unloading of the wafer holder into and out of the furnace are the most critical situations. It appeared that most of the damage on substrates that were subjected to high temperature thermal processing occurred during the end and start of the process, during which times the temperature is fairly low. On the other hand, the damage was found on substrates that had been subjected to high temperature processing. As explained below, the damage has been determined to be related to the type of substrate holder, rather than being due to the high temperatures per se.

Figure 3:
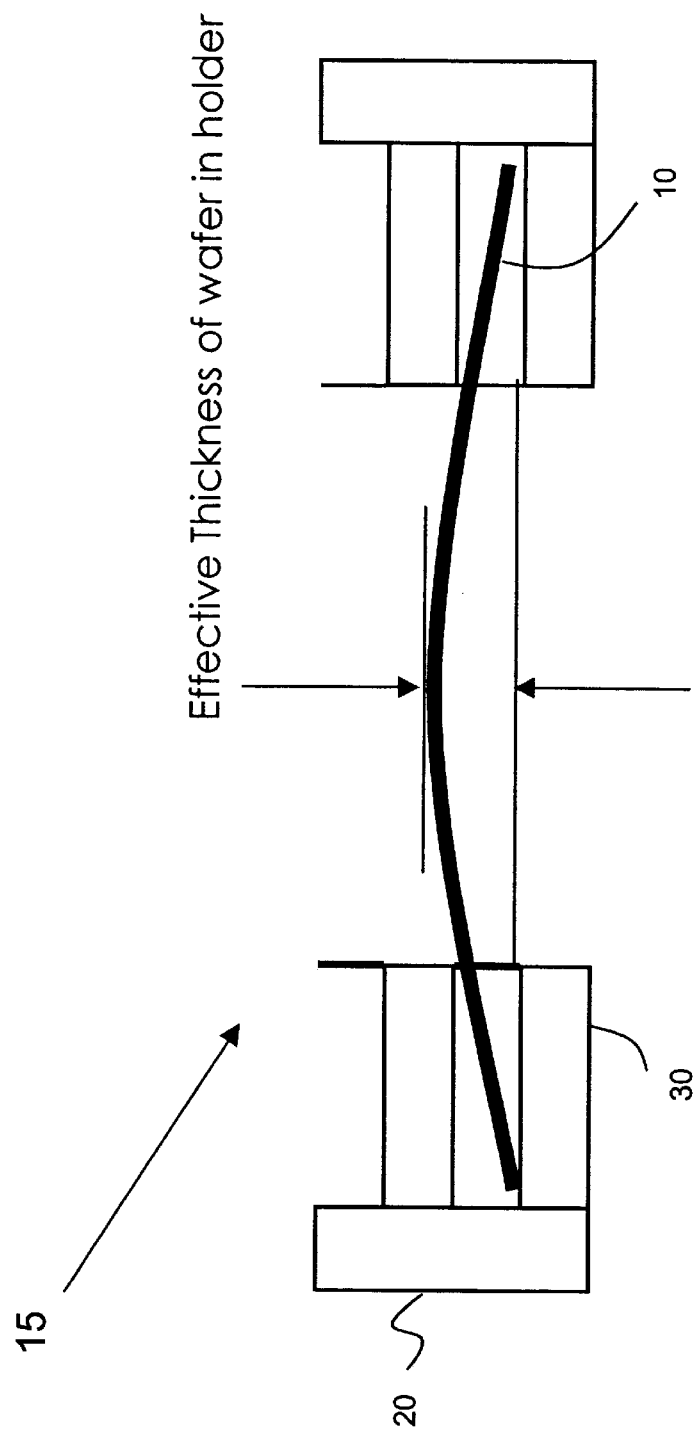
FIG. 3 is a schematic cross section of a wafer held within a vertical furnace boat, illustrating wafer bow relative to the support structures of the boat.

FIG. 3 is a side elevation of a substrate 10 accommodated in a substrate holder 15. The substrate holder 15 or "vertical boat" comprises vertically extending support bars 20 to which horizontally extending support members 30 are attached. The horizontally extending support members 30 extend inwardly to support the substrate 10 at an inner area of the substrate 10. The substrate 10 shows a critical amount of upward bow. Any further bowing, relative to the illustrated position, will result in the front face of the substrate 10 making contact with the lower surfaces of the support members 30 positioned directly above the substrate. When the substrate 10 bows downwardly, a similar critical bow exists. In addition to a pure bow (resulting in a bowl shape), the wafer can also asymmetrically warp, resulting in comparable problems.

Figure 4:
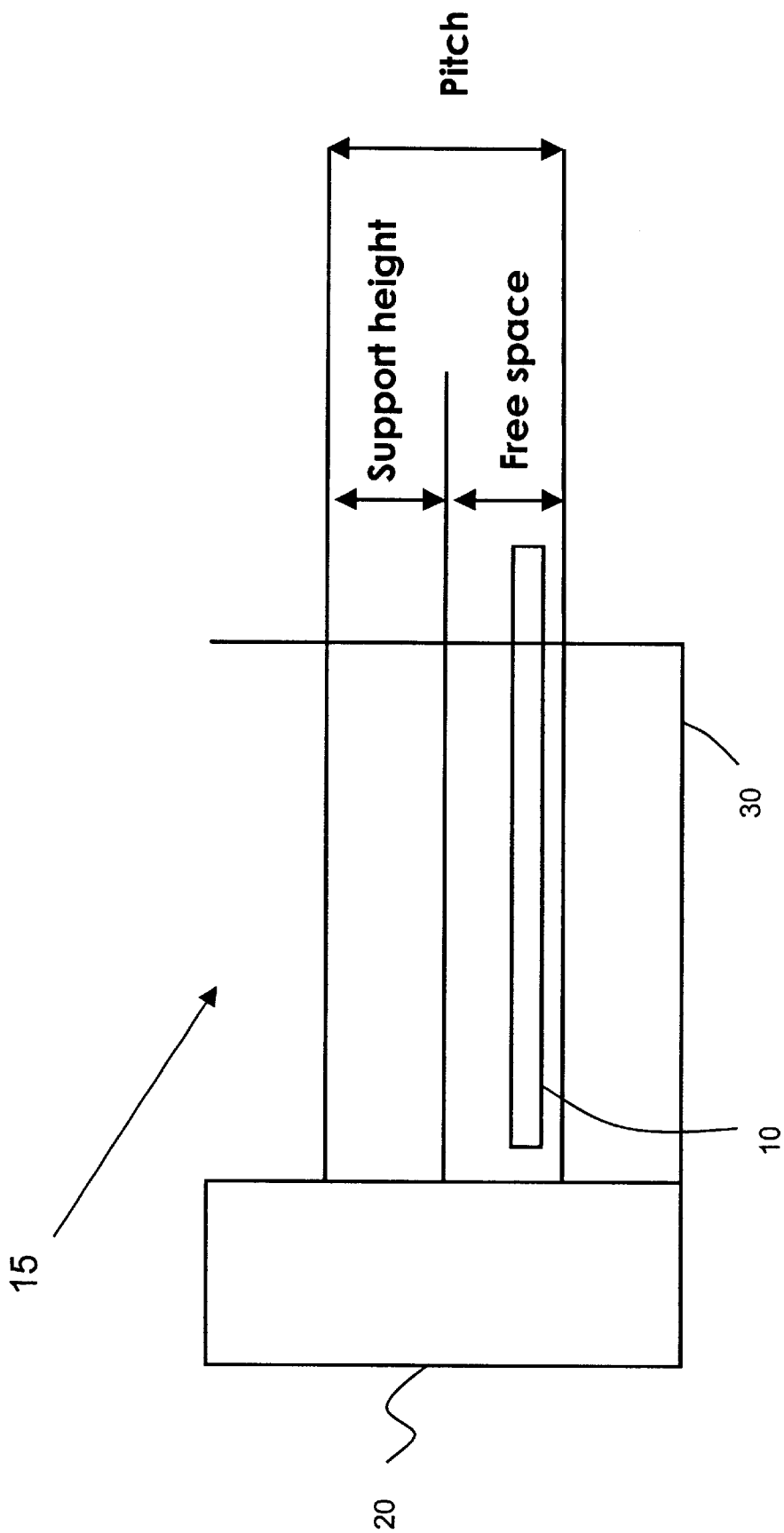
FIG. 4 is a schematic cross section of one end of a wafer and the supporting structure, illustrating open space, free space and pitch of the support structures in accordance with preferred embodiments of the present invention.

FIG. 4 shows a substrate accommodation or "slot" in the substrate holder 15 in more detail. Three important measures of the substrate holder 15 are: 1) the pitch of the substrate accommodations, determining how many substrates 10 can be accommodated within a given height; 2) the height of the support members 30; and 3) the free space or free height between support members 30. Of course, all other things being equal, the skilled artisan would desire a minimum pitch, such that more wafers could be fit within a given vertical furnace and the throughput (number of substrates processed per unit time) can be maximized.

A relation between free space in a wafer accommodation or slot and maximum allowable unloading temperature was determined, based on theoretical modeling and experimental observation. This relation is represented by the graph shown in FIG. 5. The line in the graph marks the border between scratch-free processing and scratched processing, where the upper-left part of the graph indicates conditions for scratch-free processing and the lower-right part of the graph indicates conditions that result in scratched processing. In other words, for a given free space within a wafer slot, the unloading temperature should be lower than the value indicated by the line; and for a given unloading temperature, the free space should be more than the value indicated by the line. Preferably, the unloading temperature ($T_{unload}$) for a processed batch of substrates after cool-down is about the same as the loading temperature ($T_{load}$) for an unprocessed batch of substrates prior to heat-up.

The skilled artisan will appreciate, of course, that the precise relationship between the free space or clearance within each substrate accommodation and the unloading and/or loading temperature will vary for different circumstances. For example, FIG. 5 reflects the precise relationship as measured for a standard 300-mm silicon wafer supported on a particular centrally-supporting, vertical boat for use in an Advanced 412® vertical reactor, commercially available from ASM International N.V. of Bilthoven, The Netherlands. While different substrate materials, thicknesses and sizes may obtain different curves, as compared to FIG. 5, the general relationships and general shape of the curve is expected to remain similar, i.e., the higher the unloading and/or loading temperature, the greater the free space should be to avoid scratching.

Figure 5:
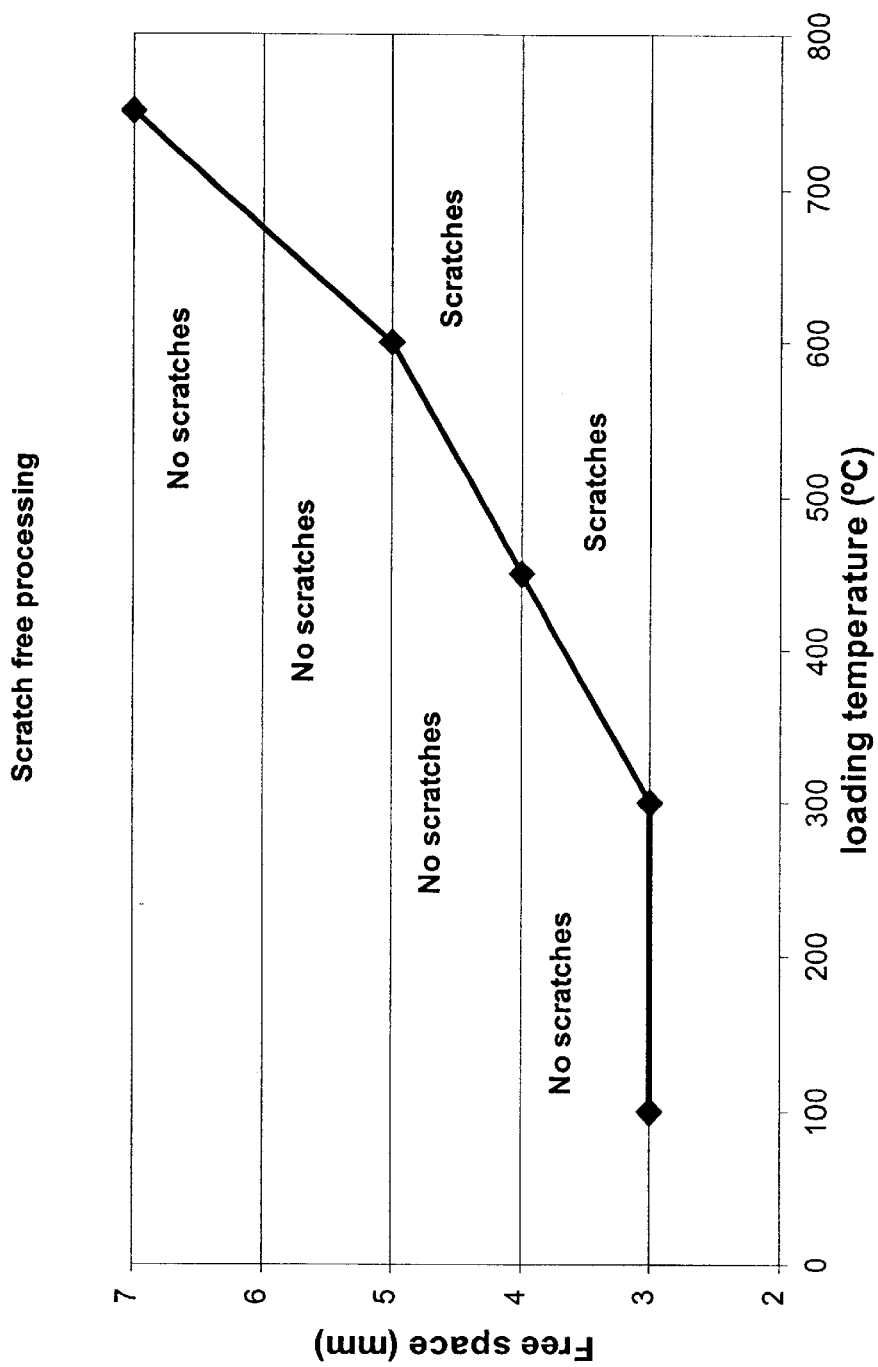
FIG. 5 is a graph illustrating a relationship between loading temperature and free space or height within the substrate supporting structures of a vertical furnace in order to avoid scratching.

Accordingly, the skilled artisan will appreciate in view of the present disclosure that the manufacturer can set a desired loading and/or unloading temperature and determine, from a chart similar to that of FIG. 5, the minimum free space that will avoid substrate scratching. In general, the higher the loading/unloading temperatures, the faster a batch of substrates can be processed (and the higher the throughput), since less heat-up and cool-down time is needed when the loading/unloading temperatures are closer to the processing temperature. Conversely, the manufacturer can set a desired free space and determine, from a chart similar to that of FIG. 5, the maximum loading and/or unloading temperature that will avoid substrate scratching. In general, the smaller the free space, the more substrates can be vertically stacked within a given vertical furnace, and consequently the higher the throughput. While the concept is presented herein by reference to the "free space" within a wafer slot (see FIG. 4), skilled artisan will readily appreciate, in view of the present invention, that the relationship can equivalently be characterized in terms of "clearance" between the top surface of a supported substrate and the lower surface of support members overlying that substrate. Such reference to clearance would account for the thickness of a standard substrate.

In view of the foregoing considerations, loading and/or unloading temperatures are preferably set to a temperature greater than about 300° C., more preferably greater than about 400° C., and most preferably greater than about 500° C. to minimize temperature ramp times. Accordingly, the height of free space between the upper surface of a support structure and the lower surface of the next higher support structure (particularly inwardly placed supports, as discussed above) is preferably greater than 4.5 mm, more preferably greater than 5 mm, to avoid scratching. On the other hand, the free space is desirably small enough to allow a pitch of less than about 15.5 mm, such that the free space is preferably less than 12 mm, more preferably less than 8 mm and most preferably about 55 mm. A sufficient stacking density is thereby afforded to allow (in a typical flat zone in a furnace of 90 cm length) the simultaneous processing of greater than about 50 substrates within the same support holder 15, more preferably greater than about 75 substrates, without undue risk of scratching and most preferably, greater than about 100 substrates. In the illustrated embodiment, having a free space of 5 mm and a pitch of 8.5 mm, 105 wafers are readily accommodated within a single vertical boat, allowing a batch of 100 product wafers (along with five "filler" wafers, added for strengthening the stack) to be simultaneously processed within the Advanced 412® vertical furnace.

Although the loading and unloading temperature have been found to be heavily related to the incidence of scratches on the substrate, the substrate holder loading/unloading speed also has a significant influence. When the speed was decreased from 300 mm/min to 100 mm/min, a significant reduction in number of scratches was observed. Wafer boat movement during loading and unloading is thus preferably conducted at less than about 300 mm/min, and more preferably less than about 100 mm/min.

Furthermore, the heat-up rate and cool-down rate of the furnace appeared to have a significant effect on the occurrence of scratches. Preferably, the heat-up rate is kept below about 5° C./min, and preferably cool-down rates are also kept below about 5° C./min, within the whole temperature range below 900° C.

Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

I claim:

1. A method for thermal treatment of substrates, comprising:

providing a holder comprising a plurality of accommodations in a vertically spaced apart relationship, each accommodation capable of at least partially horizontally supporting a substrate at an inner area spaced more than 20 mm from the substrate edge, and each accommodation having a free height (h);

placing a plurality of substrates in the holder;

loading the substrate holder with the plurality of substrates into a vertical furnace at a loading temperature ($T_{load}$);

heating the furnace to a thermal treatment temperature;

performing the thermal treatment at the thermal treatment temperature;

cooling down the furnace after performing the thermal treatment to an unloading temperature $T_{unload}$;

unloading the substrate holder from the furnace after cooling down; and selecting one of (h) and ($T_{unload}$) and determining the other of (h) and ($T_{unload}$) according to a predetermined relationship between the free height and the unloading temperature in which scratching of the substrates is avoided.

2. The method of claim 1, wherein the predetermined relationship comprises an empirically determined minimum free height for a given desired unloading temperature.

3. The method of claim 1, wherein the predetermined relationship comprises an empirically determined maximum unloading temperature for a given desired free height.

4. The method of claim 1, wherein $T_{load}=T_{unload}$.

5. The method of claim 1, wherein the unloading speed is 300 mm/min or less.

6. The method of claim 5, wherein the unloading speed is 100 mm/min or less.

7. The method of claim 1, wherein the furnace cools down from 900° C. to the unloading temperature at a rate of about 5° C./min or less.

8. The method of claim 1, wherein the furnace heats up from loading temperature to 900° C. at a rate 5° C./min or less.

9. The method of claim 1, wherein the predetermined relationship is determined based upon clearance in each accommodation above a substrate of standard thickness.

10. A method of avoiding scratches on substrates supported in a vertical furnace, each substrate being at least partially supported at a point at least 20 mm from the substrate edge, the method comprising:

providing a substrate rack with a plurality of vertically stacked support slots, the slots having a set free height between a lower surface of a first supported substrate and a support structure above the supported substrate;

selecting an unloading temperature to avoid substrate scratching for the set free height; and processing a batch of substrates supported in the substrate rack at a process temperature;

cooling the substrates from the process temperature to the selected unloading temperature; and unloading the rack at the selected unloading temperature.

11. The method of claim 10, wherein the process temperature is greater than about 900° C.

12. The method of claim 11, wherein the process temperature is greater than about 1000° C.

13. The method of claim 12, wherein the process temperature is greater than about 1100° C.

14. A method of designing a substrate rack for supporting a batch of vertically spaced substrates in a vertical furnace, the method comprising:

setting an unloading temperature to which substrates are cooled after thermal processing and before unloading; and selecting a minimum free height between a lower surface of a supported substrate and a support structure above the supported substrate for the set unloading temperature to minimize scratching.

* * * * *